United States Patent [19]

Numata

[11] Patent Number: 4,555,671
[45] Date of Patent: Nov. 26, 1985

[54] CIRCUIT FOR DRIVING A SIGNAL METER FOR A RECEIVER

[75] Inventor: Tatsuo Numata, Tokyo, Japan

[73] Assignee: Pioneer Electronic Corporation, Tokyo, Japan

[21] Appl. No.: 462,865

[22] Filed: Feb. 1, 1983

[30] Foreign Application Priority Data

Feb. 2, 1982 [JP] Japan .................................. 57-15197

[51] Int. Cl.$^4$ .............................................. H03F 3/45
[52] U.S. Cl. ........................................ 330/252; 330/2; 455/211
[58] Field of Search ........................... 330/2, 252, 261; 455/155, 211

[56] References Cited

U.S. PATENT DOCUMENTS 4,109,206 8/1978 Numata ........................... 455/155 X
4,429,416 1/1984 Page ................................ 330/252 X
4,442,549 4/1984 Main .................................... 455/211

Primary Examiner—Eugene R. LaRoche
Assistant Examiner—Steven J. Mottola
Attorney, Agent, or Firm—Sughrue, Mion, Zinn, Macpeak & Seas

[57] ABSTRACT

A signal meter driving signal is derived from first and second active elements connected in parallel and controlled by opposite phase differential outputs from an IF amplifier. The active elements are biased with a bias voltage which differs by a predetermined amount from the d.c. output of the differential amplifier when no IF input signal is present.

7 Claims, 4 Drawing Figures

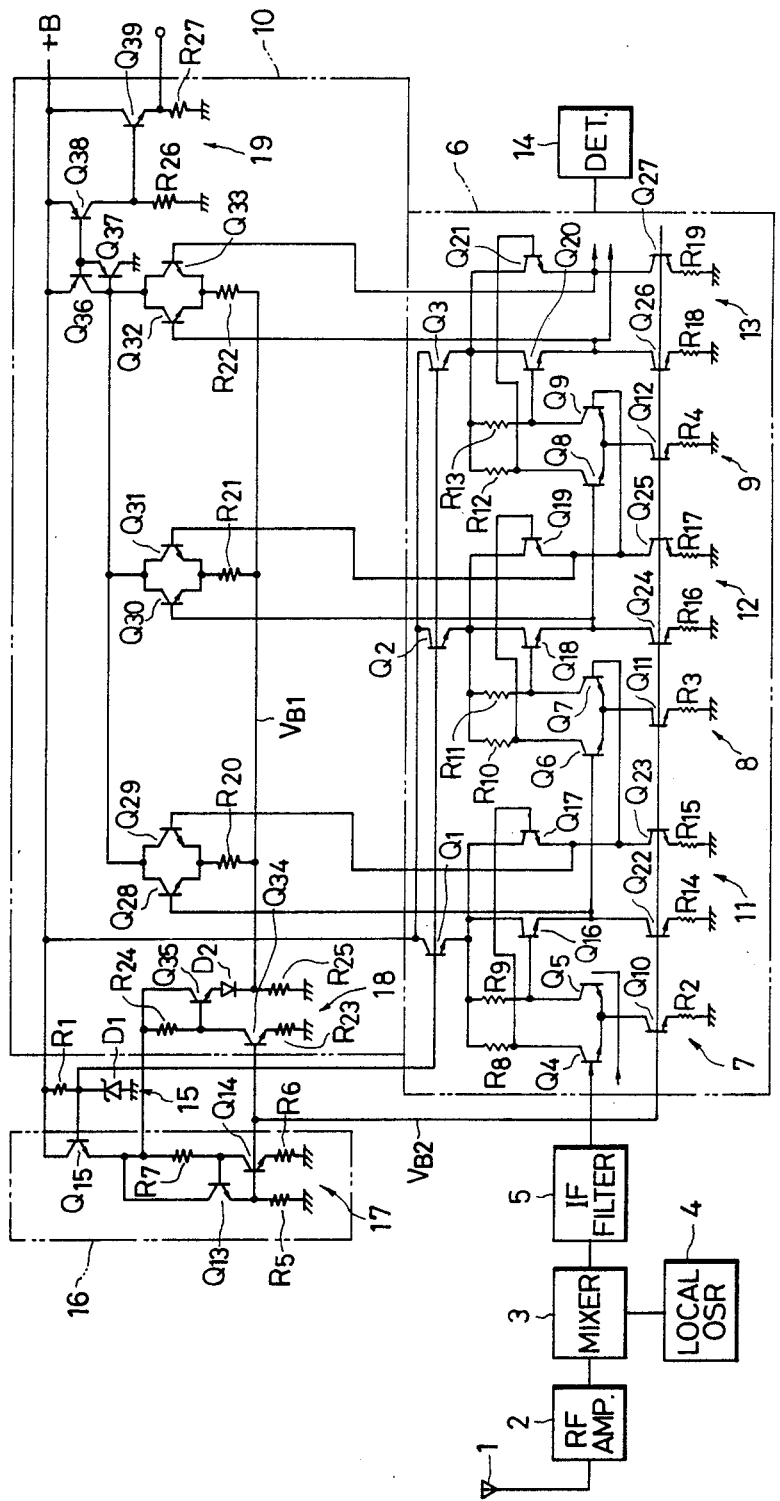

CIRCUIT FOR DRIVING A SIGNAL METER FOR A RECEIVER

BACKGROUND OF THE INVENTION

This invention relates to a circuit for driving a signal meter for a receiver.

An IF amplifier for a receiver is often so constructed that a plurality of differential amplifiers are cascade connected in several stages and so that the differential output of a differential amplifier in the final stage is transmitted to a detection circuit in the next stage. A circuit for driving a signal meter according to the IF level in the IF amplifier is often designed, particularly when IC's are employed, to half-wave rectify the IF signal from the IF amplifier to thereby generate a driving voltage. However, in the conventional circuit thus constructed for driving a signal meter, when the center value of a driving output voltage is determined so that the voltage changes according to the input level of an antenna as indicated, for example, by an actual line a in FIG. 1, variations in the driving output voltage occur in the portion between actual lines b and c in FIG. 1 because of the variations in the performance of transistors, coupling capacitors and the like for use in the half-wave rectifier circuit. When the output voltage characteristics follow the actual line c in FIG. 1 because of such variations, a meter shows no indication even if the input level of the antenna becomes so high that the meter must read up-scale. Further, when the output voltage characteristics follow the actual line b in FIG. 1, the meter may indicate up-scale even though the input level of the antenna is zero, causing the offsetting of the meter.

SUMMARY OF THE INVENTION

Accordingly, an object of the present invention is to provide a circuit for driving a signal meter for a receiver which circuit is able to suppress variations in the output level caused by the lack of uniformity in component elements to thereby eliminate the above-described disadvantages of no indication by a meter even if the input level of an antenna becomes high and the occurrence of meter offset.

The circuit for driving a signal meter for a receiver according to the present invention is constructed as follows. A pair of differential outputs of a differential amplifier to which an IF signal is inputted are applied to respective control electrodes of a pair of active elements. The electrodes of the pair of active elements to be controlled are commonly connected to each other. A bias voltage is applied to the pair of active elements, which bias voltage corresponds to a current approximately proportional to an output current of a constant current source of the differential amplifier. Thus, a driving signal for driving the meter is derived from the commonly connected electrodes of the pair of active elements.

BRIEF DESCRIPTION OF THE DRAWINGS

FIG. 2 is a block and schematic diagram of a circuit showing a part of a receiver using an example of the circuit constructed according to the present invention.

DETAILED DESCRIPTION OF THE INVENTION

Figure 1:
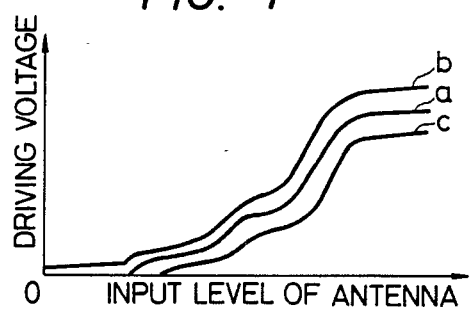
FIG. 1 is a graphic representation illustrating the characteristics of a conventional circuit for driving a signal meter for a receiver.
Figure 3:
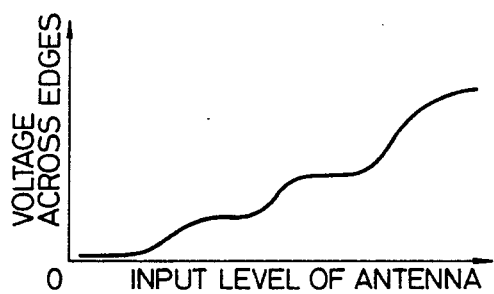
FIGS. 3 and 4 are graphic representations illustrating the characteristics of an example of the circuit according to the present invention.

Referring now to FIGS. 2 and 3, the present invention will be described in detail.

FIG. 2 illustrates part of a receiver including the circuit according to the present invention for driving a signal meter. A RF (high frequency) signal received from an antenna 1 is first amplified by a RF amplifier 2 and mixed with a local signal by a mixer 3, before being converted into an IF signal. The local signal for the mixers is provided by a local oscillator 4.

The IF signal obtained is differentially supplied to an IF amplifier 6 through an IF filter 5. The IF amplifier 6 is formed with differential amplifiers 7–9 cascade connected in three stages and output derivation circuits 11–13 for guiding the balanced differential outputs of the differential amplifiers 7–9 in these stages to the next stage and to the circuit 10 according to the present invention for driving the signal meter. In addition, the balanced output produced by the output derivation circuit 13 in the final stage is given to a detection circuit 14 as an input. In the case of the AM band, the detection circuit 14 is an AM detection circuit.

Power is supplied to each of the differential amplifier 7, and output derivation circuit 11, differential amplifier 8 and output derivation circuit 12, and differential amplifier 9 and output derivation circuit 13 from the emitters of respective transistors Q1, Q2 and Q3. To each collector of the transistors Q1, Q2 and Q3, voltage power +B is supplied, whereas a constant voltage generated by a constant voltage generator circuit 15 comprising a resistor R1 and a constant voltage diode D1 is applied in common to the bases of the transistors Q1, Q2 and Q3.

The differential amplifiers 7–9 are provided with differential transistors Q4 and Q5, Q6 and Q7, and Q8 and Q9, and a constant current source for these transistors consists of transistors Q10–Q12 and resistors R2–R4. A predetermined bias voltage $V_{B2}$ provided as an output from a bias voltage generator circuit 16 is applied in common to the base of each of the transistors Q10–Q12. The bias voltage generator circuit 16 includes a constant current circuit 17 comprising transistors Q13 and Q14 and resistors R5, R6 and R7, and power is supplied to this constant current circuit 17 from the emitter of a transistor Q15 which has its collector supplied with the power voltage +B. A constant voltage is applied to the base of the transistor Q15 from the constant voltage generator circuit and the voltage across the resistor R5 is outputted as the bias voltage $V_{B2}$.

Load resistors R8–R13 are connected to the collectors of the differential transistors Q4–Q9 and the voltage across these load resistors are given to the output derivation circuits 11–13, respectively. The output derivation circuits 11–13 are each provided with emitter follower transistors Q16 and Q17, Q18 and Q19, and Q20 and Q21 with the balanced differential outputs of the differential amplifiers 7–9 as base inputs, and the loads of the emitter follower transistors Q16–Q21 are each constant current loads comprising transistors Q22–Q27 and resistors R14–R19. Furthermore, the predetermined bias voltage is provided to the base of each of the transistors Q22–Q27.

Each emitter follower output is applied to the base of a respective one of the transistors Q28, Q29, Q30, Q31, Q32 and Q33 in the circuit for driving the signal meter. The corresponding controlled electrodes of these transistors Q28 and Q29, Q30 and Q31, Q32 and Q33, that is, all the collectors and all the emitters, are respectively coupled together, with a predetermined bias voltage VB1 supplied to the common emitters from a bias voltage supply circuit 18 as a bias means through resistors R20, R21 and R22. The bias voltage supply circuit 18 includes a constant current circuit consisting of a transistor Q34 whose base is supplied with the bias voltage $V_{B2}$ and a resistor R23, and the voltage across the ends of the collector resistor R24 of the transistor Q34 is applied to the base of an emitter follower transistor Q35. The level of the emitter follower output forming the output of the transistor Q35 is shifted by the diode D2 and the output becomes the bias voltage VB2. A load resistor R25 of the transistor Q35 is connected between the cathode of the diode D2 and ground.

On the other hand, the common collectors of the transistors Q28–Q33 are further commonly connected to the input side of an output circuit 19. The output circuit 19 includes a current mirror circuit comprising transistors Q36, Q37 and Q38, and the output common to the collectors of the transistors Q28–Q33 is supplied to the input side of the mirror circuit. The voltage across an input resistor R26 of the mirror circuit is applied to an emitter follower circuit formed of a transistor Q39 and a resistor R27. The emitter follower output of the transistor Q39 is then supplied to the signal meter (not shown).

Figure 4:
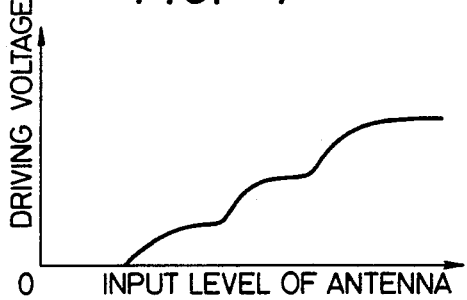

In the above-mentioned arrangement, if the resistance values of resistors R2, R3, R4, R14, R15, R16, R17, R18, R19 and R23 are all equal and the values of R8, R9, R10, R11, R12, and R13 are twice as large as the value of R24, the transistors Q28–Q33 will operate in Class B as an AM detector. In other words, in the absence of an input signal, a voltage less than the bias voltage $V_{B1}$ by a voltage approximately equal to the forward voltage of the diode D2 will be applied to the bases of the transistors Q28–Q33. This will be insufficient to turn on the transistors Q28–Q33, and all of these transistors will be turned off. When the IF input signal rises or falls, appropriate sides of the differential amplifier stages begin conducting to a greater extent sufficient to turn on, through the output derivation transistors, one side of each of the active element pairs. As a result, the collectors common to the transistors Q28, Q29, Q30, Q31 and Q32, Q33 generate a full-wave rectified current almost proportional to the level of the input signal until each of the differential amplifiers 7, 8, 9 functions as a limiter as the level of the input signal increases. For this reason, the voltage across the ends of the resistor R26 in the output circuit 19 and the driving voltage generated from the output circuit 19 each change as shown in FIGS. 3 and 4 according to the input level of the antenna, so that the signal meter (not shown) is driven according to the input level of the antenna.

Even if variations in the resistance value of each resistor and the characteristics of each transistor occur in the arrangement described above, when the ratio of one resistor to any other resistor in the IF amplifier 6 and the signal meter driving circuit 10 is approximately equal to a preset value and when the differences of characteristics between transistors is small, all the transistors Q28–Q33 will be off when no signal is received, whereas a full-wave rectified current roughly proportional to the level of an input signal will be produced by the common collectors of the transistors Q28–Q33 when an IF input signal is applied. Thus, the output voltage characteristics conform substantially to those shown in FIG. 4 and variations in the driving voltage are reduced. Consequently, although it is difficult to improve the accuracy of the absolute value of the resistances, the accuracy of the relative ratio of resistances may be relatively easily increased. If the circuit according to the present invention for driving a signal meter is employed for a receiver formed with semiconductor integrated circuits featuring transistors obtainable with uniform characteristics, it will prevent the occurrence of disadvantages such as no indication shown by the meter as the input level of an antenna increases and the offsetting of the meter. In addition, because the two transistors in each active element pair are driven by signals of opposite phases, it is possible to obtain a detection output twice as large as that available when a single AM detection transistor is used, and the detection efficiency is increased to that extent. Still further, each output of the output derivation circuits 11–13 is supplied to each of the transistors Q28, Q29, Q30, Q31, and Q32, Q33 through direct coupling without using coupling capacitors and the like, and therefore there is no restriction on the number of frequencies to be used. Accordingly, the circuit according to the present invention for driving a signal meter for a receiver is most suitable for use in a signal meter circuit for an FM tuner.

I claim:

1. A circuit for driving a signal meter in a receiver of the type having an intermediate frequency (IF) amplifier for amplifying an IF input signal, said IF amplifier having a d.c. voltage output in the absence of said IF input signal, said circuit comprising at least one control terminal and at least one controlled terminal and controlling the signal at its controlled terminal in accordance with a control signal applied to its control terminal, means for driving a signal for driving said signal meter in accordance with the signal at said at least one controlled terminal, means for providing said amplifier output to said at least one control terminal, and bias means for biasing an active element circuit with a first bias voltage having a predetermined difference with respect to said d.c. voltage output;

wherein said amplifier is a differential amplifier having at least first and second differential outputs, and said one active element circuit includes at least one pair of active elements, each active element circuit being associated with a respective first and second pair of differential outputs and each said active element circuit having control and controlled terminals, corresponding controlled terminals of said active elements being coupled together and said first and second differential outputs of said differential amplifier being applied to said control terminals of respective active elements.

2. A circuit for driving a signal meter for a receiver as claimed in claim 1, wherein said differential amplifier comprises first (Q4) and second (Q5) transistors having emitters connected together to form a differential pair, first (R8) and second (R9) resistors connected as collector resistors of said first and second transistors, the resistances of said first and second resistors being equal, a third transistor (Q10) with a collector connected to the common contact point between the emitters of said first and second transistors and with a base to which a second bias voltage is applied, means (16) for generating said second bias voltage (VB2), a third resistor (R2) connected as the emitter resistor of said third transistor, said bias means including a fourth transistor (Q34) with a base to which said second predetermined bias voltage is applied, a fourth resistor (R23) with a resistance having a first predetermined ratio to the resistance of said third resistor and connected as an emitter resistor of said fourth transistor, a fifth resistor (R24) with a resistance having a second predetermined ratio to the resistance of said first resistor and connected as a collector resistor of said fourth transistor, a voltage corresponding to the voltage generated across said fifth resistor being produced as said first predetermined bias voltage.

3. A circuit for driving a signal meter for a receiver as claimed in claim 1, wherein said differential amplifier includes a plurality of cascade connected differential amplifier stages each having first and second differential outputs and said at least one pair of active elements comprise an equal plurality of active element pairs, the differential outputs of each differential amplifier stage being provided to control terminals of a respective one of said active element pairs.

4. A circuit for driving a signal meter for a receiver as claimed in claim 2, wherein said means for providing said differential amplifier output to said at least one control terminal comprises at least first and second output derivation transistors each having collector and base terminals coupled across a respective one of said first and second resistors with the bases coupled to the junction point of the first or second resistor and the respective first or second transistor, third and fourth output derivation transistors each having a collector connected to an emitter of a respective one of said first and second output derivation transistors and a base receiving said second bias voltage, and first and second output derivation resistors having resistance values equal to that of said third resistor and connected between ground and the emitter of a respective one of said third and fourth output derivation transistors, the signals at the emitters of said first and second output derivation transistors being supplied to control terminals of respective ones of said pair of active elements.

5. A circuit for driving a signal meter as claimed in claim 2, wherein said third and fourth resistors have equal resistance values.

6. A circuit for driving a signal meter as claimed in claim 4, wherein said third and fourth resistors have equal resistance values.

7. A circuit for driving a signal meter as claimed in claim 6, wherein the resistance values of said first and second resistors are twice that of said fifth resistor.

* * * * *